United States Patent
Keeth et al.

(10) Patent No.: US 6,465,331 B1
(45) Date of Patent: Oct. 15, 2002

(54) DRAM FABRICATED ON A SILICON-ON-INSULATOR (SOI) SUBSTRATE HAVING BI-LEVEL DIGIT LINES

(75) Inventors: Brent Keeth, Boise, ID (US); Charles H. Dennison, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/655,000

(22) Filed: Aug. 31, 2000

(51) Int. Cl.[7] .................. H01L 21/20; H01L 21/336; H01L 27/01; H01L 27/108
(52) U.S. Cl. .................. 438/479; 438/149; 438/266; 438/587; 257/296; 257/347; 257/350
(58) Field of Search .................. 438/149, 479, 438/587, 258, 266, 311; 257/347, 350, 301, 296; H01L 21/8242, 27/108

(56) References Cited

U.S. PATENT DOCUMENTS

| | | | | |
|---|---|---|---|---|
| 4,889,832 A | * | 12/1989 | Chatterjee | 438/270 |
| 5,102,819 A | * | 4/1992 | Matsushita et al. | 438/245 |
| 5,170,243 A | * | 12/1992 | Dhong et al. | 257/304 |
| 5,312,782 A | * | 5/1994 | Miyasawa | 257/330 |
| 5,314,841 A | * | 5/1994 | Brady et al. | 438/533 |
| 5,371,032 A | * | 12/1994 | Nishihara | 438/152 |
| 5,424,235 A | * | 6/1995 | Nishihara | 438/155 |
| 5,571,730 A | * | 11/1996 | Park et al. | 438/269 |
| 5,661,063 A | * | 8/1997 | Lee | 438/253 |
| 5,753,529 A | * | 5/1998 | Chang et al. | 438/118 |
| 5,776,789 A | * | 7/1998 | Nakamura | 438/155 |
| 5,792,685 A | * | 8/1998 | Hammerl et al. | 438/243 |
| 5,936,280 A | * | 8/1999 | Liu | 257/347 |
| 5,939,745 A | * | 8/1999 | Park et al. | 257/304 |
| 5,942,778 A | * | 8/1999 | Oikawa | 257/301 |
| 5,959,322 A | * | 9/1999 | Lee | 257/298 |
| 6,031,260 A | * | 2/2000 | Sunouchi | 257/296 |
| 6,043,562 A | * | 3/2000 | Keeth | 257/776 |
| 6,215,155 B1 | * | 4/2001 | Wollesen | 257/351 |
| 6,232,155 B1 | * | 5/2001 | Lee | 438/149 |
| 6,294,806 B1 | * | 9/2001 | Kim | 257/296 |
| 6,297,090 B1 | * | 10/2001 | Kim | 438/253 |

OTHER PUBLICATIONS

Nishihara et al., "A Buried Capacitor DRAM Cell with Bonded SOI for 256M and 1Gbit DRAMs", Electron Devices Meeting, Dec. 13–16, 1992 pp. 803–806.*

Nakamura et al., "Giga–bit DRAM Cells with low capacitance and low resistance bit–lines on buried MOSFET's and capacitors by using bonded SOI technology–Reversed–Stacked–Capacitor (RSTC) Cell", Electron Devices Meeting, Dec. 10–13, 1995, pp. 889–892.*

Kim et al., "Advanced Integration Technology for a Highly Scalable SOI DRAM with SOC (Silicon–On–Capacitors)", Electron Devices Meeting, Dec. 8–11, 1996, pp. 605–608.*

Eimori et al., "Approaches to Extra Low Voltage DRAM Operation by SOI–DRAM", IEEE Trans. on Electron Devices, May 1998, pp. 1000–1009.*

* cited by examiner

Primary Examiner—Matthew Smith
Assistant Examiner—Lex H. Malsawma
(74) Attorney, Agent, or Firm—Dorsey & Whitney LLP

(57) ABSTRACT

A DRAM having bi-level digit lines is fabricated on a silicon-on-insulator ("SOI") substrate. More specifically, the digit lines of each complimentary digit line pair are positioned on opposite sides of the SOI substrate. In one embodiment, digit lines are formed between memory cell capacitors, and in a second embodiment, digit lines are formed above the capacitors.

32 Claims, 9 Drawing Sheets

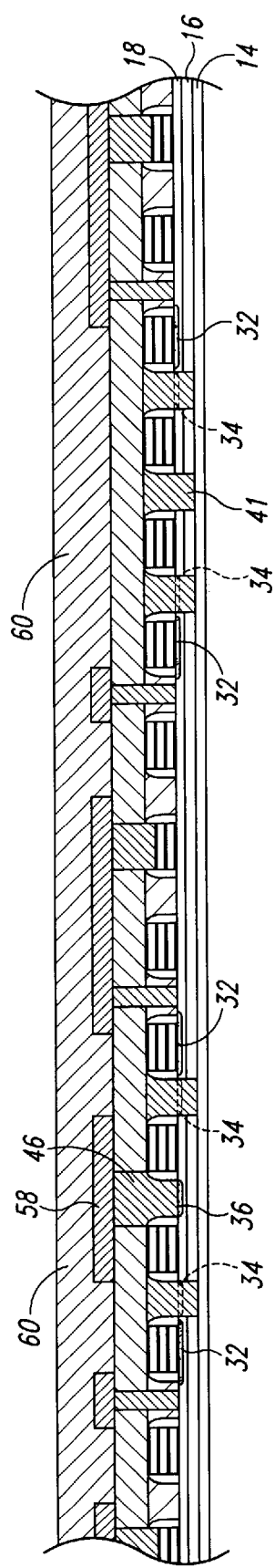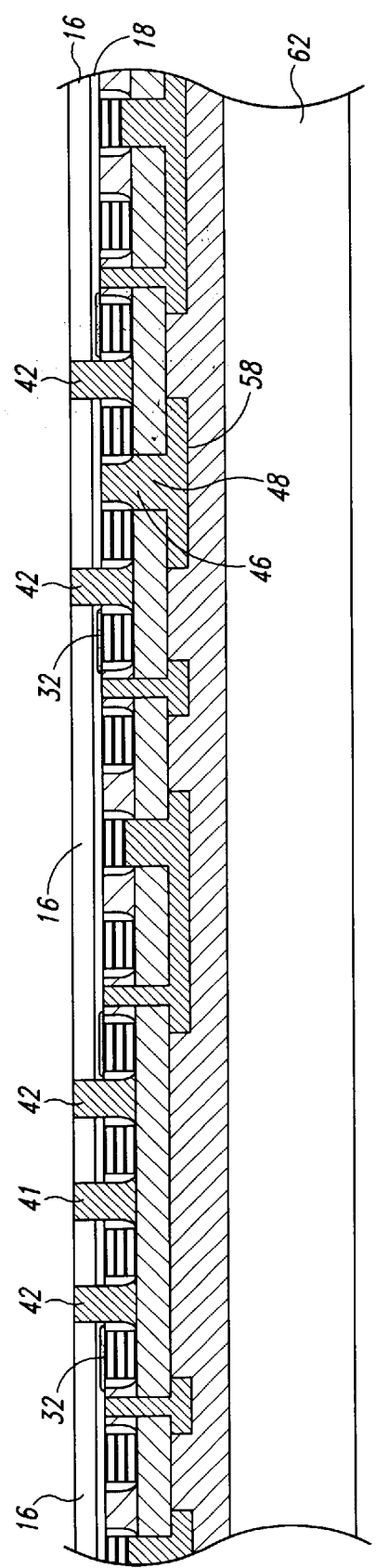
Fig. 4
Fig. 5

DRAM FABRICATED ON A SILICON-ON-INSULATOR (SOI) SUBSTRATE HAVING BI-LEVEL DIGIT LINES

TECHNICAL FIELD

The invention relates to dynamic random access memories ("DRAMs"), and more particularly to a folded digit line array DRAM having bi-level digit lines.

BACKGROUND OF THE INVENTION

Early DRAMs were manufactured with an "open digit line" architecture, in which a first digit line of a complementary pair extended from a respective sense amplifier through a first array, and a second digit line of the complementary pair extended from the sense amplifier through a second array. Therefore, in these early DRAMs, the memory cells in each column of the first array were selectively coupled to one digit line, and the memory cells in the corresponding column of the second array were selectively coupled to its complementary digit line. An advantage of this open digit line architecture is that it allows memory cells to occupy a relatively small area, i.e., $6F^2$, where "F" is the minimum feature size of a semiconductor process. Unfortunately, the digit lines in an open digit line architecture are susceptible to picking up noise. As a result, a "folded digit line" architecture was developed.

FIG. 12 is a functional block diagram of a conventional memory-cell array 1200 having a folded-digit line architecture. The array 1200 includes a plurality of memory cells 1202 arranged in rows and columns, each memory cell including an access transistor 1204 and storage capacitor 1206, as shown for one cell. Each memory cell 102 in a respective row is coupled to a corresponding word line WL and each memory cell in a respective column is coupled to one of a pair of complementary digit lines DL, DL*. A plurality of sense amplifiers 1208 are coupled to respective pairs of complementary digit lines DL, DL*. Each memory cell 1202 includes an access transistor 1204 coupled to the word line WL of the corresponding row, and when activated the access transistor the storage capacitor 1206 to one of the digit lines DL, DL* in the corresponding column.

In a folded digit line architecture, both complementary digit lines extend from a sense amplifier through the same array substantially in parallel with each other. Since the digit lines are parallel to each other for substantially their entire lengths, they pick up the same noise signals, thus allowing a sense amplifier to which they are coupled to have good common mode noise rejection. DRAMs having a folded digit line architecture are thus less susceptible to noise. Unfortunately, the requirement that an additional digit line extend through the array increases the size occupied by each memory cell. In fact, memory cells in a folded digit line architecture have a minimum size of $8F^2$.

Attempts have been made to reduce the minimum size of folded digit line memory cells by vertically spacing the digit lines in each complementary pair rather than horizontally spacing them apart at the same level. By spacing the digit lines vertically, the area occupied by a memory cell can be reduced to 6F. Unfortunately, it has been difficult to fabricate bi-level digit lines because of the large number of components that must be formed on the surface of a semiconductor substrate. The difficulty in fabricating bi-level digit lines in DRAMs having a folded digit line architecture has prevented their widespread use. As a result, folded digit line DRAMs have generally been significantly larger than open digit line DRAMs of the same capacity, thus making folded digit line DRAMs more expensive. Therefore, a need exists to be able to more easily manufacture DRAMs having bi-level digit lines so that DRAMs having folded digit line architectures can be manufactured at less cost.

SUMMARY OF THE INVENTION

A DRAM array having a folded digit line architecture is fabricated on a silicon-on-insulator substrate. The array includes bi-level digit lines that are fabricated on opposite sides of a silicon portion of the substrate. As a result, the digit lines for each digit line pair may occupy the same footprint, thus allowing the array to be relatively small. Access transistors coupled to each of a plurality of memory cells may be coupled to either of the digit lines, or they may be alternately coupled to the digit lines. The digit lines of each pair are preferably "twisted" at least once as they extend through the array so that they have the same electrical characteristics.

BRIEF DESCRIPTION OF THE DRAWINGS

FIG. 4 is a cross sectional view of the device shown in FIG. 3C in a further stage of fabrication.

FIG. 5 is a cross sectional view of the device shown in FIG. 4 which has been turned 180 degrees about the latitudinal axis.

DETAILED DESCRIPTION OF THE INVENTION

Integrated circuits have traditionally been fabricated on a surface of a semiconductor substrate. The substrate, which is in the form of a wafer of monocrystalline silicon, is selectively doped and multiple layers of insulative material, polysilicon, and metal are formed on its surface. More recently, techniques have been developed to manufacture integrated circuits on a layer of monosilicon positioned above an insulative substrate. This technique is known as "silicon-on-insulator" or "SOI".

The advent of SOI fabrication techniques has created the possibility of fabricating components on opposite sides of an active silicon region of the SOI substrate. In accordance with an embodiment of the invention, most of the components of a DRAM, including one digit line in a complementary pair, are fabricated adjacent one surface of an active silicon layer of the SOI substrate. The other digit line in the complementary pair is fabricated in the insulative material adjacent the opposite surface of the active silicon layer. As a result, both of the bi-level digit lines need not be fabricated on the same side of the active silicon layer, thus reducing the fabrication complexities traditionally encountered in fabricating bi-level digit lines. One embodiment of a technique for fabricating bi-level digit lines in a DRAM having a folded digit line architecture will now be explained with reference to FIGS. 1–9.

DETAILED DESCRIPTION OF THE PREFERRED EMBODIMENTS

The invention in its broadest embodiment is directed to a method of fabricating memory cells in a folded-digit line array for use in a semiconductor device in which a transistor array is first formed on a substrate. Thereafter, capacitors are formed on one side of the substrate. A pair of digit line conductors are then formed on the opposite sides of the substrate. The capacitor is electrically connected to one of a source and drain region, while the digit lines are electrically connected to respective others of the source and drain region.

Reference herein shall be made to the terms "substrate" and "wafer", which are to be understood as including a silicon-on-insulator (SOI) or silicon-on-sapphire (SOS) structures, doped and undoped semiconductors, epitaxial layers of silicon supported by a base semiconductor foundation, and other semiconductor structures. In addition, when reference is made to a "substrate" or "wafer" in the following description, previous process steps may have been utilized to form arrays, regions or junctions in or on the base semiconductor structure or foundation. In addition, the semiconductor need not be silicon-based, but could be based on silicon-germanium, germanium, indium phosphide, or gallium arsenide. The term "substrate" as used herein may also refer to any type of generic base or foundation structure.

Figure 1A:
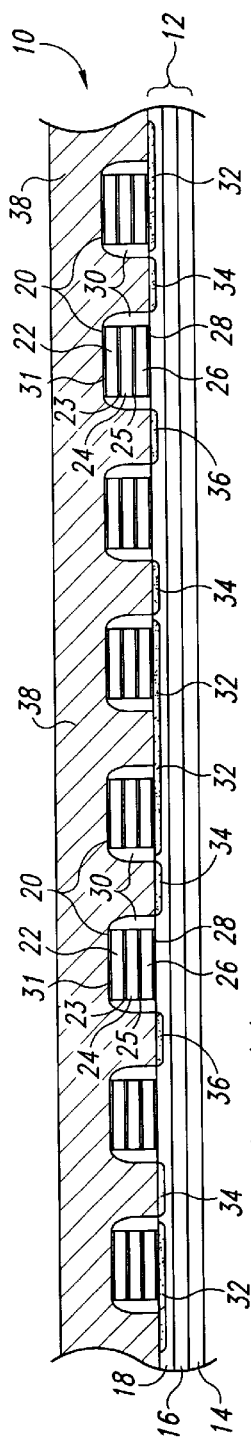
FIG. 1A is a cross sectional view of a semiconductor device in an intermediate stage of fabrication according to a first embodiment of the invention.

Referring again to the drawings in which like numerals indicate that components throughout the various embodiments, FIG. 1A shows a semiconductor device 10 in an intermediage stage of fabrication. According to one embodiment of a method of the invention, the device 10 is first fabricated with a basic silicon-on-insulator (SOI) structure using materials and methods known in the art. Shown is a silicon-on-insulator (SOI) substrate 12 having first and second silicon layers 14, 18 and an insular region 16 between the silicon layers. The insulator region 16 may also be referred to as a "box" layer and may be formed of suitable insulating material such as silicon dioxide ($SiO_2$), for example.

After SOI formation, transistor gate stacks 20 are formed in an array on the substrate 12 using successive Chemical Vapor Deposition (CVD), Low Pressure Chemical Vapor Deposition (LPCVD), sputtering and other known processes, followed by conventional photolithography and etching techniques. Each gate stack 20 is comprised, for example, of a cap layer 22, e.g. nitride-containing or oxide-containing material, which is formed over a thin sandwich oxide layer 23. The sandwich oxide layer 23 is in turn formed over a conductive layer 24 which may be comprised of tungsten, tungsten silicide, or cobalt silicide. The conductive layer 24 may be formed atop an optional polycrystalline silicon (polysilicon) layer 26. The polysilicon layer 26 may optionally be doped with boron, arsenic or germanium. In certain embodiments it may be desirable to include a diffusion barrier layer 25 between the conductive layer 24 and the polysilicon layer 26. The diffusion barrier layer 25 will inhibit diffusion of atoms from the conductive layer 24, and may be formed of titanium nitride, tantalum nitrade and titanium tungsten, for example. Between the polysilicon layer 26 and the silicon layer 18 of the substrate 12 is a thin gate oxide layer 28. All the foregoing layers making up the gate stack 20 can vary in thickness from a few Angstroms to a few thousand Angstroms.

A spacer film 30 protects the sides of the gate stack 20. The spacer film 30 is typically formed of a nitrade containing material such as silicon nitride ($Si_3N_4$) or alternatively an oxide-containing material. The spacer film 30 typically first overlays the entire substrate 12, and is subsequently etched back and planarized with the top of the gate stack 20. The spacer film isolates the gate stack 20 from the materials which are used in self-aligned contact etching, as hereinafter described. The spacer film 30 is typically on the order of about a few Angstroms to about a few hundred Angstroms thick. In addition to the foregoing spacer film 30, a thin protective insulating layer 31 may be formed on the tops of the gate stacks 20, and optionally over the substrate 12 as well. This protective layer 31 is comprised of suitable materials known in the art, and may be formed, for example, of tetaethylorthosilicate (TEOS).

Field oxide regions 32 are formed in the silicon region 18 to isolate the adjacent memory cells. Also implanted in the silicon region 18 of the substrate 12 are source regions 34 and drain regions 36. This configuration is for purposes of illustration only, and it is understood by the skilled artisan that alternatively, region 34 could function as the drain region, while region 36 could function as the source region. The source and drain regions may be formed by ion implantation of N+ and P+ impurities, for example, using arsenic, phosphorus, boron ions. Both the source and drain regions and the field oxide regions may be formed before or after the gate stacks described above. The gate stack 20 together with the source and drain regions 34, 36 are often referred to in the art as an access transistor in which the gate thereof forms a "word line."

In a more preferred embodiment of the invention, the source and drain regions 34, 36 shown in FIG. 1A are not heavily doped, i.e. are not N+ or P+ implanted. Instead, all N+ and P+ dopings are eliminated and N+/P+ diffusion is obtained from an N+ and/or P+ doped polysilicon contact plug, as hereinafter described, and thus the embodiment may be said to rely on LDD, or low density diffusion. In this embodiment, it will be understood by the skilled artisan that the source, drain regions 34, 36 may also be referred to individually or collectively as the undoped regions 34, 36.

As further shown on FIG. 1A, an insulate layer 38 is then deposited over the gate stacks 20 and surrounding components using methods known in the art. The insulative layer 38 is typically formed of a material such as Boro-Phospho-Silicate Glass (BPSG), which is silicon dioxide that contains boron and phosphorus atoms. The substrate formed as shown in FIG. 1A is utilized as a base structure in the formation of various embodiments of the invention.

Figure 1B:
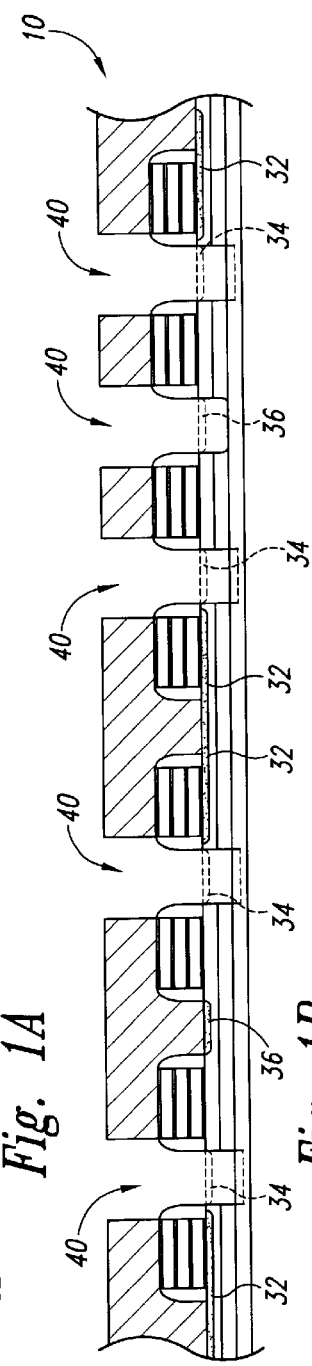
FIG. 1B is a cross sectional view of the device shown in FIG. 1A in a further state of fabrication.

According to a first embodiment of the invention shown in FIG. 1B, contact openings or vias 40 are then formed in the first insulate layer 38 using self-aligned contact etching (SAC) techniques, for example, using dry etching techniques. The self-aligned contact opening 40 uses the sides of the gate stacks 20 (protected by the spacer film 30) as a guide down to and through the substrate 12. The contact opening 40 extends into the substrate 12 through the source (undoped) regions 34, and through the silicon layer 18, the box oxide layers 16 and stops on the silicon layer 14. The contact opening 40 may also optionally extend into the silicon layer 14 as shown by the dotted lines in FIG. 1. After the contact opening 40 is formed, the sides and bottom thereof may optionally be cleaned of any etch residue using methods known in the art, for example, using an oxygen ($O_2$) plasma strip step. A follow-up metallization, for example, using a titanium-containing compound to coat the sides and/or the bottom of the contact opening 40 may be effected after the cleaning step.

Figure 2A:
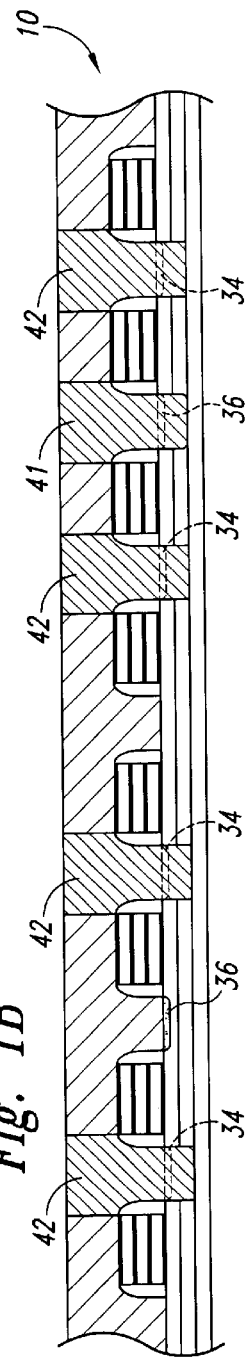
FIG. 2A is a cross sectional view of the device shown in FIG. 1B in a further state of fabrication.

Referring now to FIG. 2A, at least one conductive plug 41 or 42 is then deposited in each contact opening 40. FIG. 2A shows five conductive plugs 41, 42 in their respective contact openings 40. Each conductive plug 41, 42 is typically formed of a conductive metallic material, or more preferably may be polysilicon material which has been infused or doped with additional material such as metallic ions or other compounds, e.g. N+, and/or P+ using arsenic, boron or phosphorous. The conductive plugs 42 may also be referred to as capacitor connection plugs, since each will ultimately electrically connect a capacitor, hereinafter described, with the source region 34. The conductive plug 41 may be referred to as a digit line connection plug since it will ultimately electrically connect a digit line, hereinafter described, with the drain region 36. After deposition of the plugs 41, 42 is complete, the top of the wafer, including the top portion of the first insulative layer 38 and the corresponding top portions of the plugs 41, 42, may be etched back or planarized using chemical mechanical planarizing (CMP) techniques to be substantially coplanar with the top of the gate stack 20 as shown in FIG. 2B.

Figure 2B:
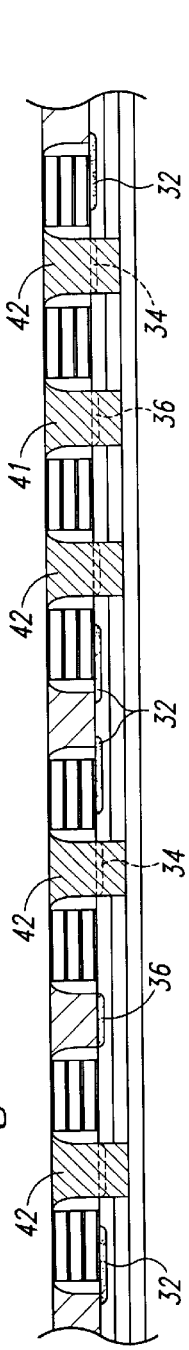
FIG. 2B is a cross sectional view of the device shown in FIG. 2A in a further stage of fabrication.
Figure 3A:
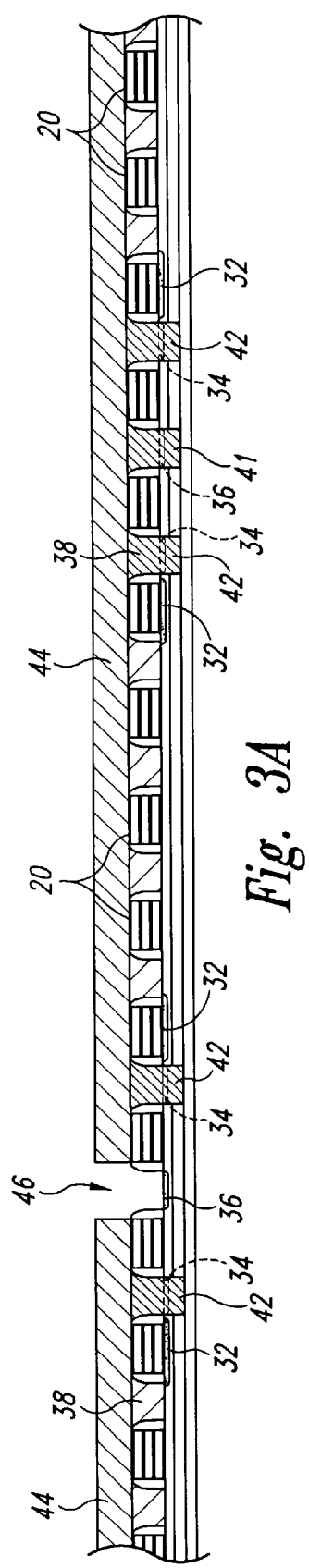
FIG. 3A is a cross sectional view of the device shown in FIG. 2B in a further stage of fabrication.

Referring now to FIG. 3A, there is shown an expanded view of the semiconductor device shown in FIG. 2B with additional gate stacks 20 and a second insulative layer 44, e.g. BPSG, which is then formed over the first insulative layer 38, the gate stacks 20 and the capacitor connection plugs 41, 42. Using SAC etching techniques as heretofore described, a digit line contact opening 46 is formed in the second insulative layer 44. The digit line contact opening 46 extends between the gate stacks 20 where shown in FIG. 3A and penetrates through the second and first insulative layers 44, 38 and stops on the surface of the silicon layer 18 above the drain (undoped) region 36. A material such as titanium may be used to coat the inside surfaces of the contact opening 46 after an optional cleaning step. This titanium material improves the adhesion of a subsequently deposited plug within the second insulative layer 44. The titanium material will also form two conductive material layers, Ti-silicide at the bottom of the contact opening and Ti-nitrade on the sides of the contact opening. These titanium-containing materials also help protect the silicon substrate 18 from being damaged during the subsequent plug deposition.

Figure 3B:
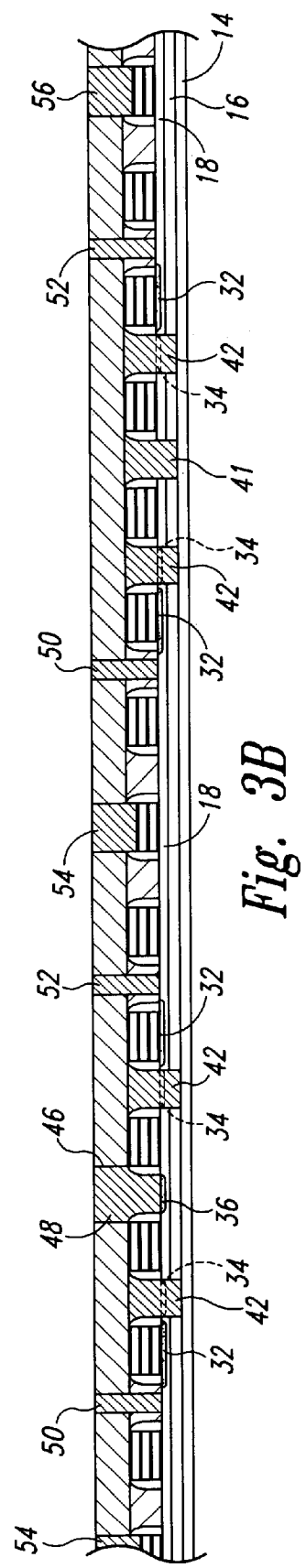
FIG. 3B is a cross sectional view of FIG. 3A in a further stage of fabrication.

As further shown in FIG. 3B, another digit line contact plug 48 is deposited in the contact opening 46 using deposition techniques known in the art. For example, tungsten hexafluoride ($WF_6$) and silane ($SiH_4$) are reacted together in a reaction chamber, followed by introduction of hydrogen gas ($H_2$) to replace the depleted silane. The digit line contact plug 48 like the digit line contact plug 41, contacts a respective drain region 36. Because the capacitators, hereinafter described, will be formed on the opposite side of the substrate 12, the height of the digit line contact opening 46 and plug 48 is unaffected by the height of the capacitors. In other words, the depth of both the contact opening 46 and subsequently deposited plug 48 will be capacitor height -independent and thus do not have to be as tall as the capacitors. Moreover, the self-aligned contact openings 40 and 46 and plugs 42 and 48 will be preserved, i.e. not affected or destroyed, during the subsequent capacitor formation.

Also shown in FIG. 3B are additional peripheral plugs 50, 52, 54 and 56 comprised of substantially the same or similar material as the tungsten-containing digit line contact plug 48. Plugs 50 and 52 extend through the second and first insulative layers 44, 38 and stop on the surface of the silicon layer 18 of the substrate 12. Plugs 54 and 56 extend into their respective gate stacks 20 and through the conductive cap layer 22 and stop at the polysilicide layer 24 as shown in FIG. 3B. (The insulating cap layer 31 has been removed during a previous photo and etch step, not shown).

Figure 3C:
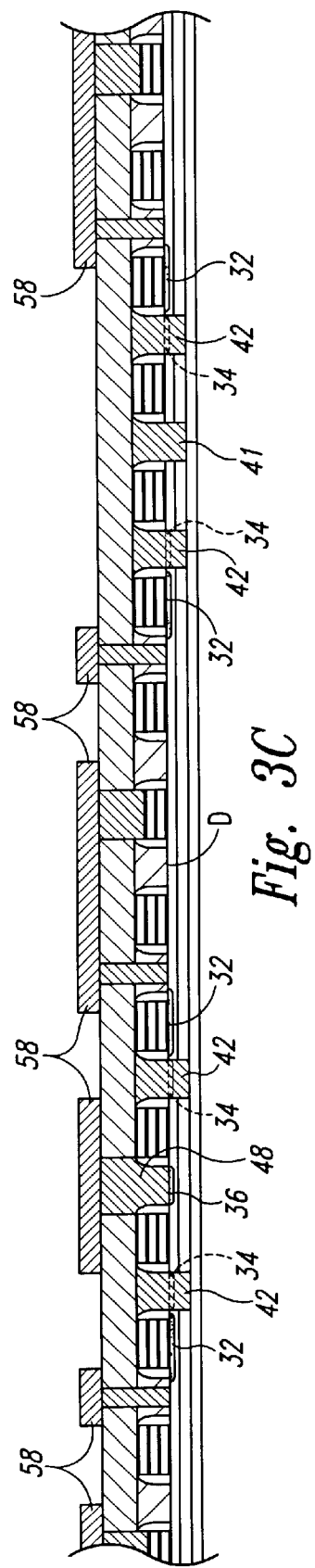
FIG. 3C is a cross sectional view of the device shown in FIG. 3B in a further stage of fabrication.

Referring now to FIG. 3C, a wiring connect or digit line conductor 58 is then formed atop the bit line contact plug 48 and the respective plugs 50, 52, 54 and 56. Each wiring connect 58 may be integrally formed with their respective plugs by extending tungsten deposition during formation of the plugs to cover the second insulative layer 44 and then patterning of the wiring connect 58 can be performed. Alternatively, the tops of the respective plugs 50, 52, 54 and 56 together with a corresponding depth of the second insulative layer 44 may be etched back or planarized using CMP techniques as heretofore described. Thereafter, the wiring connects or bit line conductors 50 can be subsequently formed atop the respective pugs using substantially the same or similar material and methods as was utilized to form the plugs, e.g. tungsten-containing material.

Referring now to FIG. 4, a third insulative layer 60, e.g. BPSG, is formed atop the second insulative layer 44 overlays the entire semiconductor array and in effect "buries" the electrical connections.

Referring now to FIG. 5, the entire semiconductor device 10 is subsequently turned over or "flipped", preferably approximately 180 degrees. Just prior to flipping, or thereafter, a handler layer 62 is affixed or bonded to the third insulative layer 60 using known semiconductor wafer bonding techniques. As further shown in FIG. 5, the now inverted silicon layer 14 is then removed by etching or CMP methods as heretofore described as well as by cleaving. This step planarizes the now-inverted capacitor connection plugs 42 with the top of the now-inverted box oxide layer 16, and thereby exposes at least the top portion of the capacitor connection plugs 42.

Figure 6:
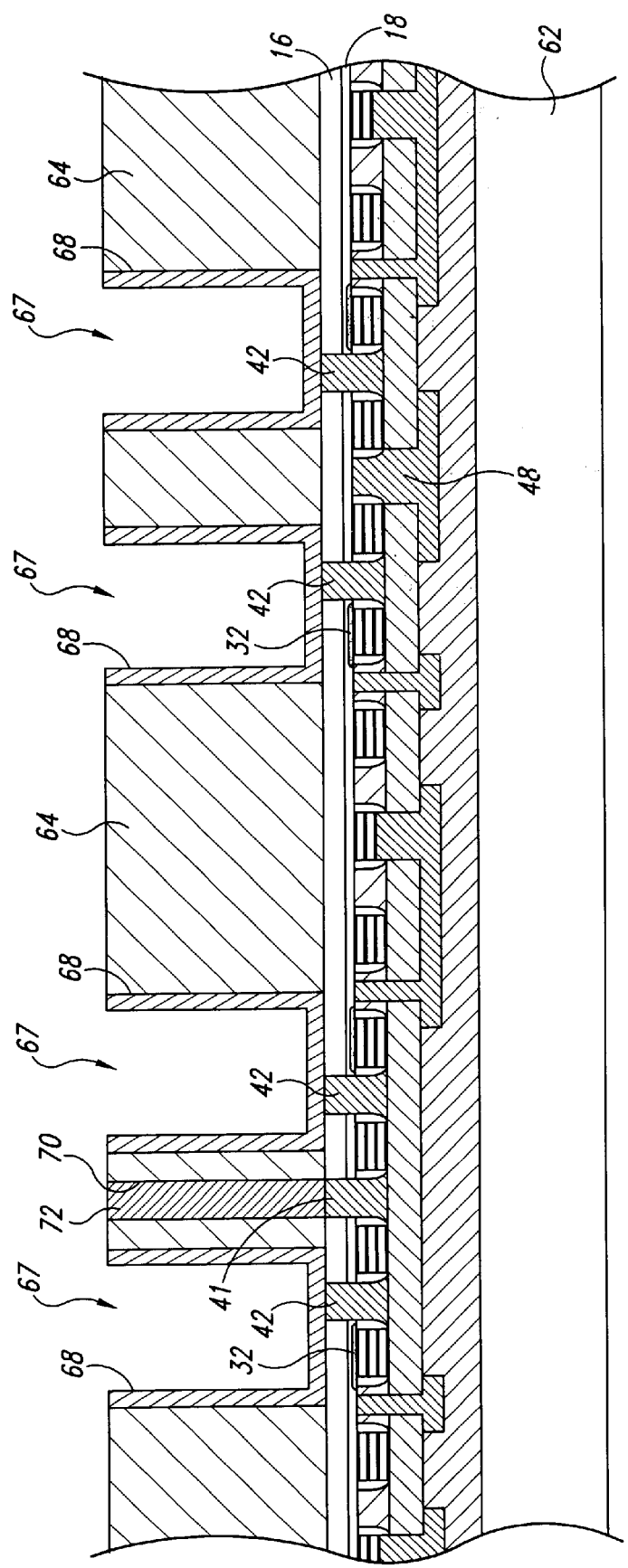
FIG. 6 is a cross sectional view of the device shown in FIG. 5 in a further stage of fabrication.

As shown on FIG. 6, a fourth insulative layer 64, e.g. BPSG, is then formed over the box oxide layer 16 and the capacitor connection plugs 42. Thereafter, the fourth insulative layer 64 is etched and capacitor openings 67 are formed down to the exposed surface of the capacitor connection plugs 42 using methods known in the art. Thereafter, a capacitor plate 68 is formed in each of the openings 67 and is electrically connected to the source region 34 of the transistor gate stack 20 via the capacitor connection plug 42. As shown in FIG. 6, using standard etching techniques, a digit line contact opening 70 is formed in the fourth insulative layer 64 in alignment with the digit line connection plug 41. A material such as titanium may be used to coat the inside of the contact opening 70 to improve the adhesion of a plug 72 of conductive material deposited within the contact opening 70. The plug 72 is deposited in the opening by conventional means so that it is in electrical contact with the digit line connection contact plug 41.

Figure 7:
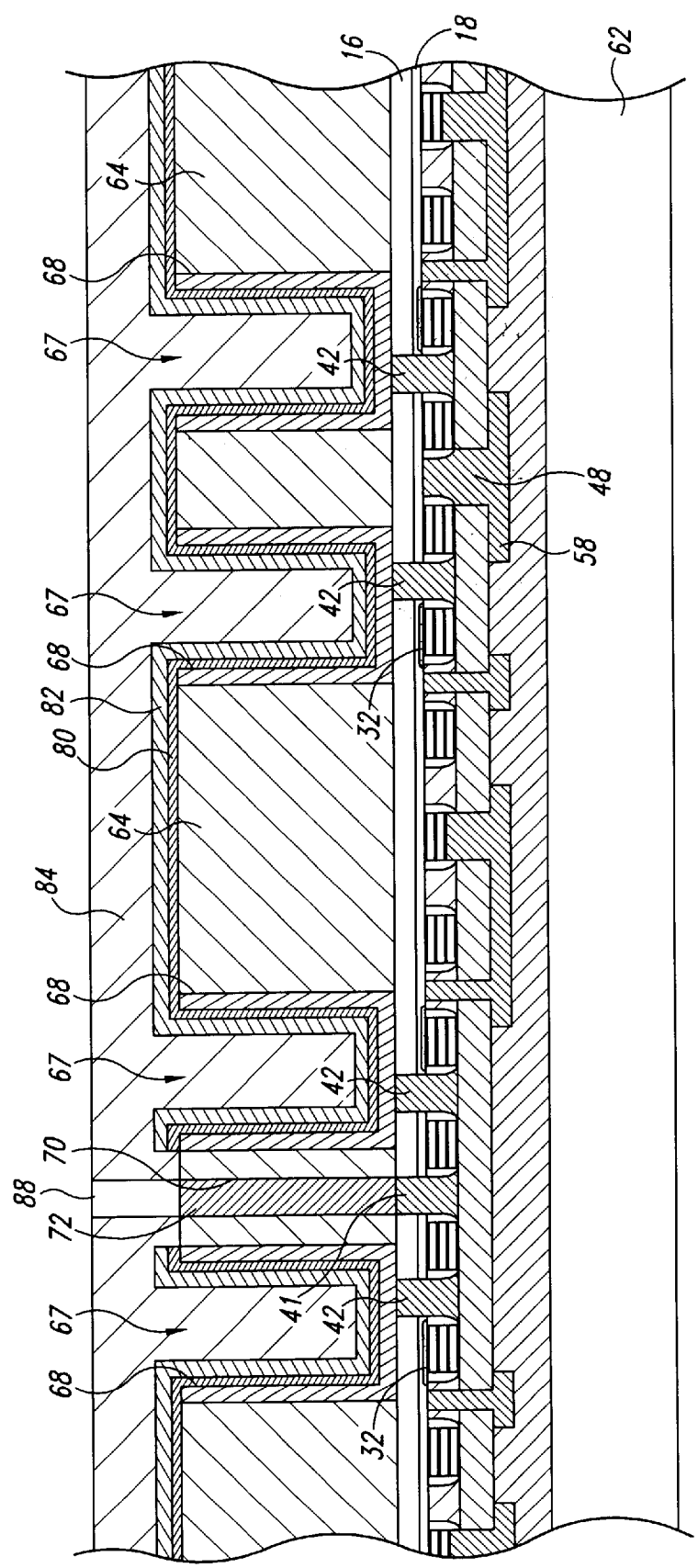
FIG. 7 is a cross sectional view of the device shown in FIG. 6 in a further state of fabrication.

As shown in FIG. 7, a layer of a dielictic material 80, such as silicon nitride, is deposited over the capacitor plates 68 and the exposed surface of the insulative layer 64. Note that the dielectric material 80 is recessed from the contact plug 72. A layer of conductive material 82, such as polysilicon, is then deposited on the dilectric material 80 to form a cell plate. Note that the conductive material 82 also terminates short of the plug 72. A suitable insulative material 84 is then deposited over the conductive material 82. The material 84 is preferably planarized by CMP prior to etching a contact opening 88 in alignment with the digit line contact plug 72.

It will be understood that the contact opening 70 for the plug 72 and the contact opening 88 for the contact plug 90 may be formed by the other means. For example, the openings 70, 88 maybe formed by a single etch after the insulative material 64, 89 has been deposited.

Figure 8:
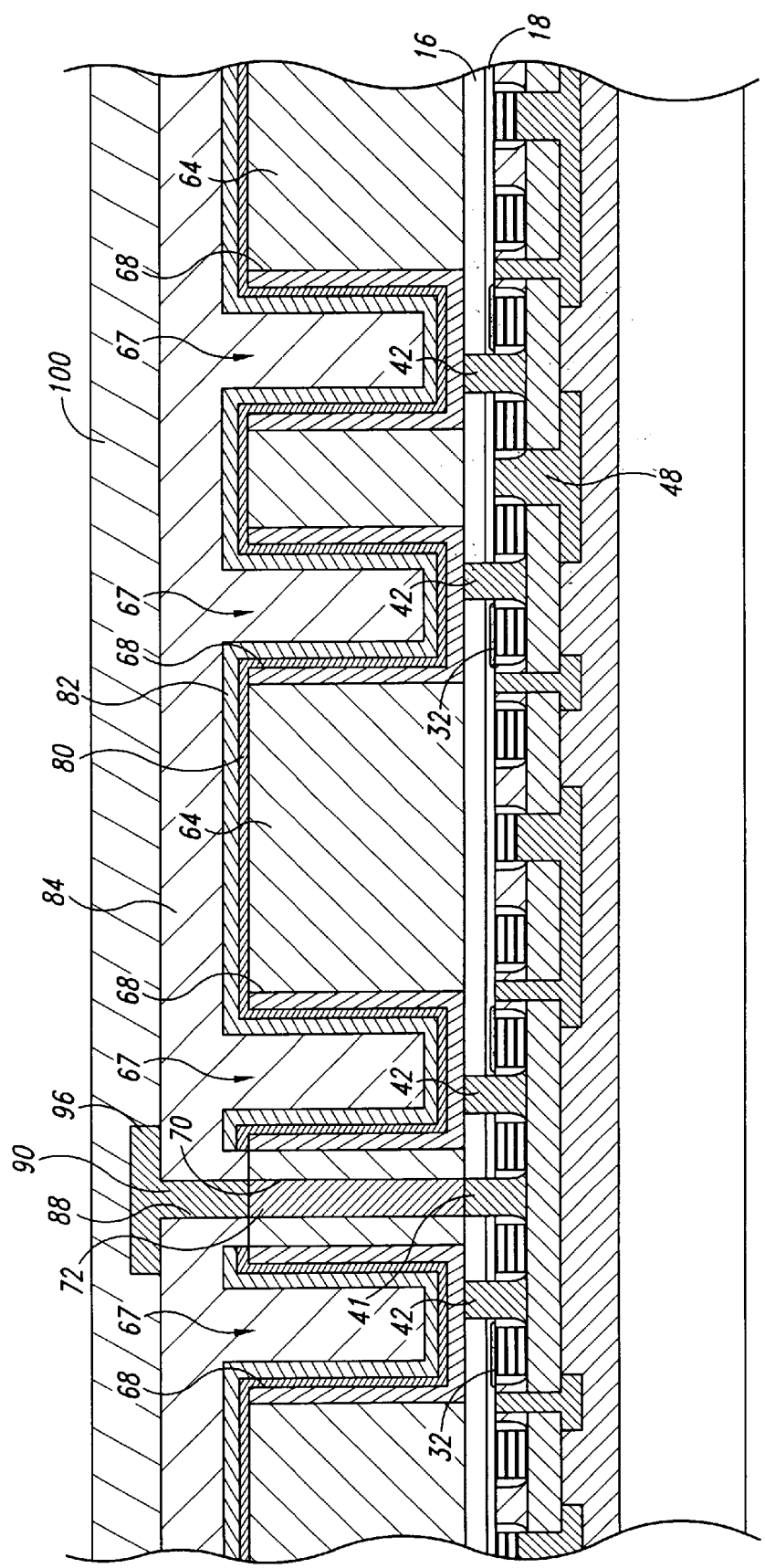
FIG. 8 is a cross sectional view of the device shown in FIG. 7 in a further state of fabrication.

As shown in FIG. 8, a digit line contact plug 90 is then formed in the contact opening 88 by suitable means. A digit line conductor 96 is then formed atop the digit line contact plug 90. The conductor 96 may be integrally formed with the contact plug 90 by suitable means, such as described above for the conductor 58 and contact plug 48. Finally, another insulative layer 100, e.g., BPSG, is formed on the insulative layer 80 using materials and methods previously described.

Figure 9:
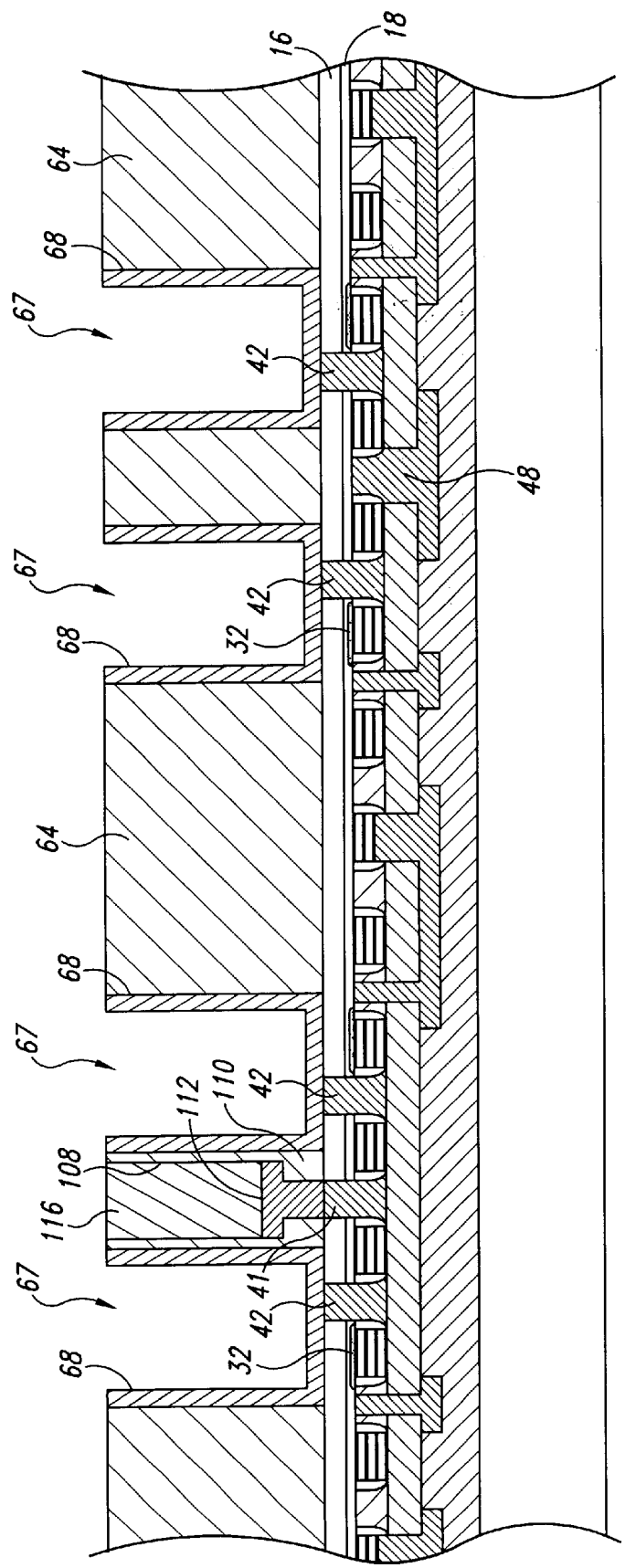
FIG. 9 is a cross-sectional view of another embodiment of the invention.

Another embodiment of the invention is shown in FIG. 9. The fabrication of this second embodiment is identical to the fabrication of the embodiment of FIGS. 1-8 up to and including the step shown in FIG. 6. Thereafter, instead of forming a contact plug 72 as shown in FIG. 7, a contact opening 108 is etched in the insulative material 64 and a short contact plug 110 and a digit line conductor 112 are formed between the capacitor plates 68 in alignment with the contact plug 49. Thereafter, an insulative material 116 is deposited in the remainder of the contact opening 108. The remainder of the components are then formed substantially as shown in FIG. 8.

It will be understood that other embodiments of the invention can instead be used. For example, with reference to FIG. 9, the capacitor plates 68 could be spared from the insulator region 16 by a layer of insulative material (not shown) and digit lines could be buried in such insulative material. As a result, a digit line conductor could be positioned beneath the capacitor plates 68.

Figure 10:
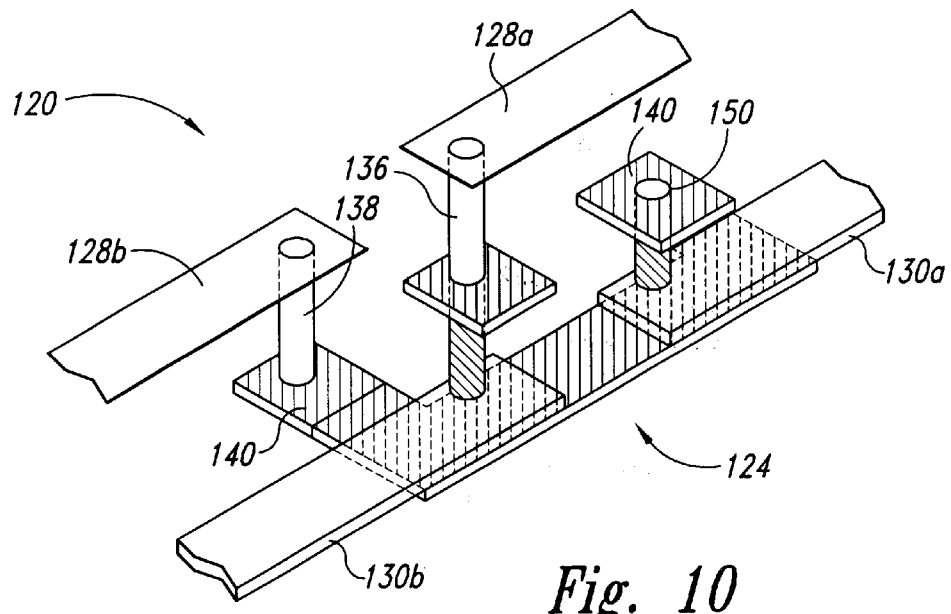
FIG. 10 is an isometric view showing one embodiment of a technique that may be used to "twist" the digit lines in the embodiment of FIGS. 1–8.

As is well understood in the art, it is important to the operation of a DRAM that the complementary digit lines of a memory array have the same electrical properties, including the same capacitance. However, the digit lines in the disclosed embodiments are inherently non-symmetrical since they are positioned on opposite sides of the substrate 12. For this reason, the digit lines may be periodically "twisted" as shown in FIG. 10. As a result, a digit line conductor 120 in one part of the memory array can be coupled to a digit line conductor 124 in a different part of the array, and vice versa. With reference to FIG. 10, the digit line conductor 120 is divided to form two upper digit line sections 128a,b. Similarly, the lower digit line conductor 124 is divided to form two lower digit line sections 130a,b. A via is formed and filled to form a conductive plug 136 that extends from the digit line section 128a, through the substrate 10, to the digit line section 130b. A second via is formed and filled to form a conductive plug 138, that extends from the digit line section 128b, to a conductor 140 formed on the subtrate. The conductor 140 has a U-shaped configuration that bypasses the conductive plug 136 and then extends above the digit line section 130a. A via is filled with a conductive material to form a plug 150 that extends from the U-shaped conductor 140 to the digit line section 130a. The plugs 138, 150 and conductor 140 thus couple the digit line section 128b to the digit line section 130a. The digit lines may be twisted in this manner one or more times as they extend through an array of memory cells so that both digit lines have the same electrical properties.

Figure 11:
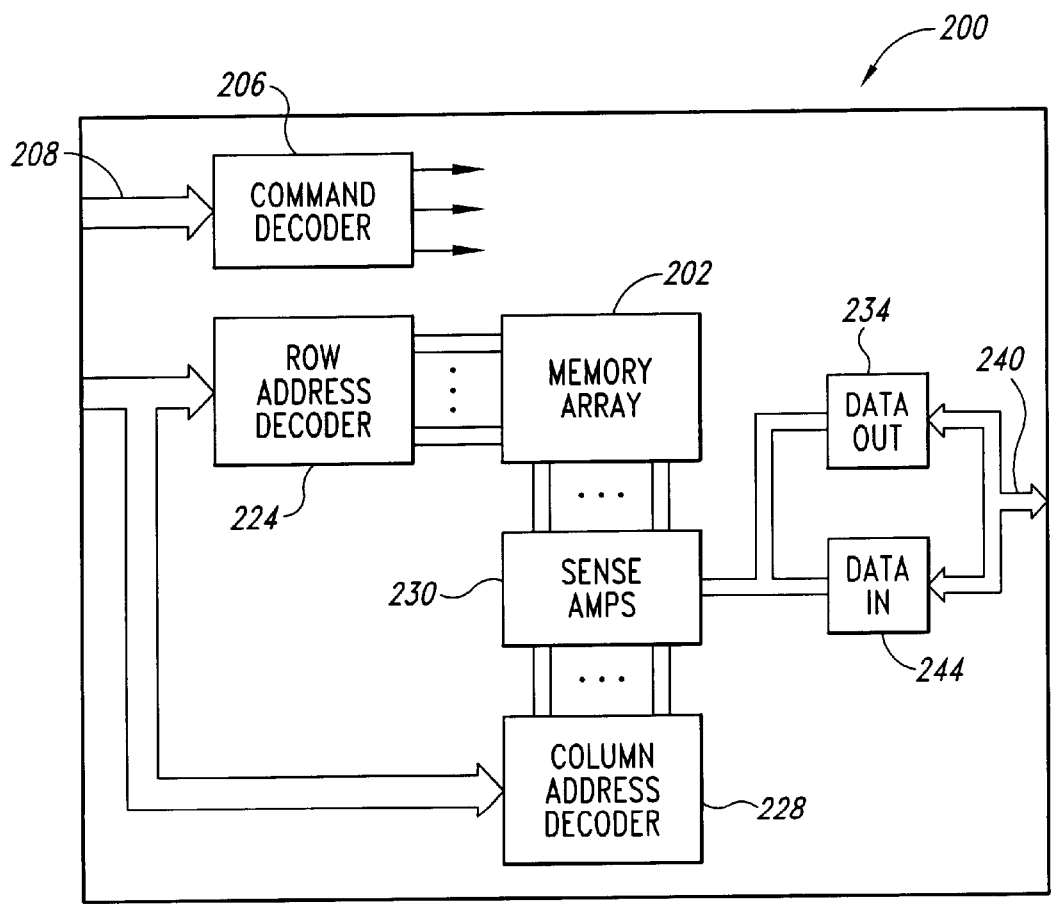
FIG. 11 is a block diagram of a typical memory device that includes one or more memory arrays of the present embodiment.
Figure 12:
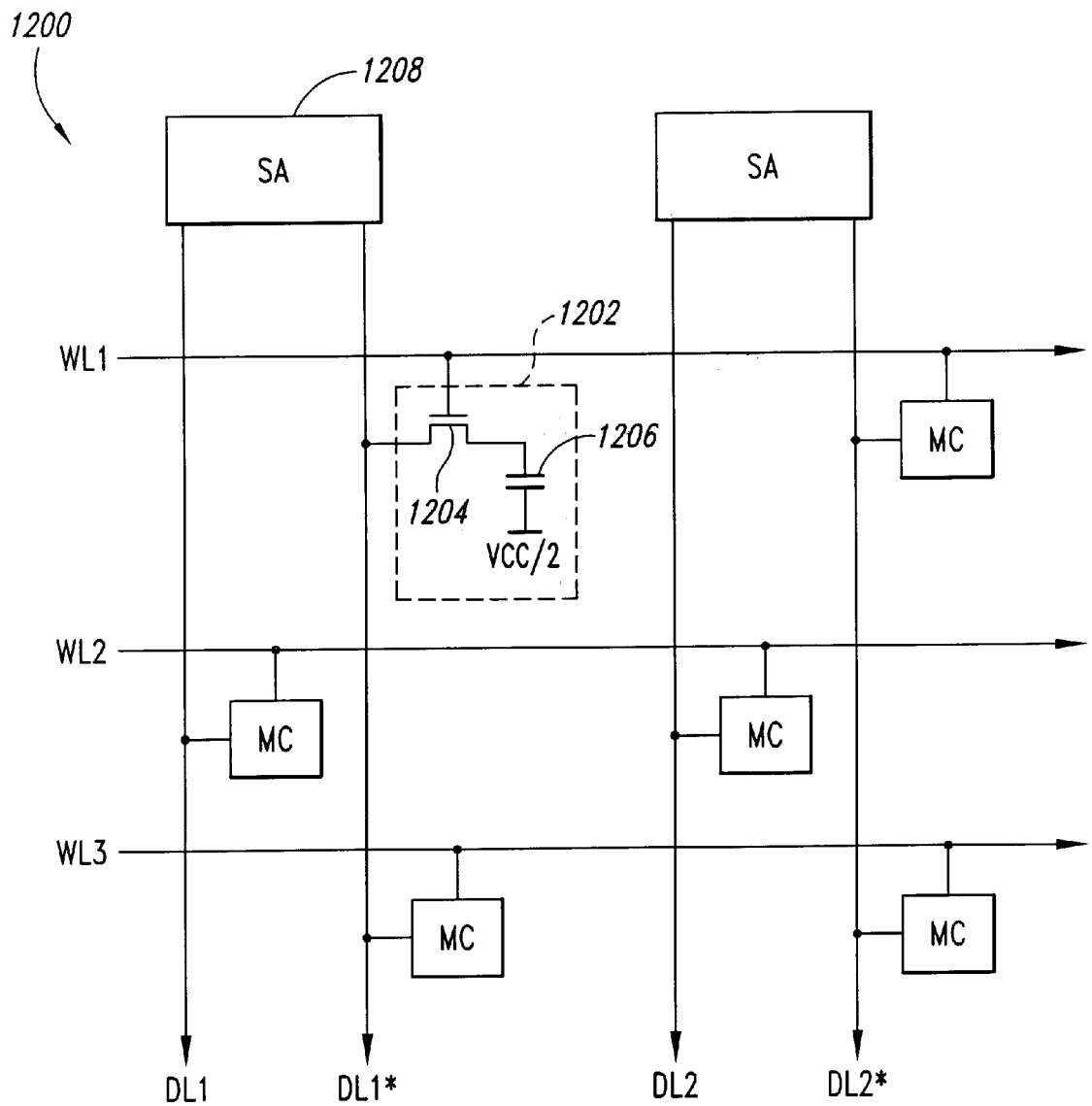
FIG. 12 is a functional block diagram of a conventional memory cell array having a folded digit-line architecture.

A memory device 200 that uses memory array 202 including bi-level digit lines (not shown) as discussed with reference to FIGS. 1–10 according to one embodiment of the invention is shown in FIG. 11. The memory device 200 includes a command decoder 206 that receives memory command through a command bus 208 and generates corresponding control signals. A row or column address is applied to the memory device 200 through an address bus 220 and is decoded by a row address decoder 224 or a column address decoder 228, respectively. Sense amplifiers 230 are coupled to the array 202 to provide read data to a data output buffer 234 that, in turn, applies the read data to a data bus 240. Write data are applied to the memory array through a data input buffer 244. The buffers 234, 244 comprise a data path.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A dynamic random access memory ("DRAM") array fabricated on a silicon-on-insulator ("SOI") substrate, comprising:

a plurality of memory cells arranged in rows and columns adjacent a first surface of an active silicon layer of the substrate;

a plurality of digit line pairs extending along each column of memory cells, at least a portion of a first digit line of each pair being fabricated adjacent the first surface of the active silicon layer, and at least a portion of a second digit line of each pair being fabricated adjacent a second surface of the active silicon layer, the second surface being opposite from the first surface; and a plurality of access transistors fabricated in the active silicon layer, each of the access transistors in each column being coupled between a respective memory cell and one of the first and second digit lines of the respective digit line pair.

2. The DRAM array of claim 1, wherein the first and second digit lines of each pair are divided into at least first and second sections that are electrically isolated from each other, and wherein the DRAM array farther comprises a pair of conductors extending through the active silicon layer of the SOI substrate for each of a plurality of digit line pairs, the first conductor for each pair coupling the first section of the first digit line to the second section of the second digit line, and the second conductor for each pair coupling the second section of the first digit line to the first section of the second digit line.

3. The DRAM array of claim 1 wherein a plurality of access transistors in each column are coupled to the first digit line of the respective digit line pair.

4. The DRAM array of claim 1 wherein at least some of the access transistors in each column are coupled to the second digit line of the respective digit line pair.

5. The DRAM array of claim 1 wherein alternating access transistors in each column are coupled to the first digit line of the respective digit line pair and the remaining access transistors in the column are coupled to the second digit line of the digit line pair.

6. The DRAM array of claim 1 further comprising a plurality of field oxide regions formed in the active silicon layer to isolate at least some of the access transistors from each other.

7. The DRAM array of claim 1 wherein the SOI substrate comprises a handler wafer.

8. The DRAM array of claim 7 wherein the memory cells comprise respective memory cell capacitors fabricated in a layer of insulative material.

9. The DRAM array of claim 7 wherein the second digit line of each pair is fabricated in a layer of insulative material.

10. The DRAM array of claim 7 wherein one of the first and second digit lines is fabricated between the handler wafer and the active silicon layer.

11. A dynamic random access memory ("DRAM") array fabricated on a semiconductor substrate, comprising
a plurality of memory cells arranged in rows and columns adjacent a first surface of the semiconductor substrate;
a plurality of digit line pairs extending along each column of memory cells, at least a portion of a first digit line of each pair being fabricated adjacent the first surface of the semiconductor substrate, and at least a portion of a second digit line of each pair being fabricated adjacent a second surface of the semiconductor substrate, the second surface being opposite from the first surface; and
a plurality of access transistors fabricated in the semiconductor substrate, each of the access transistors in each column being coupled between a respective memory cell and one of the first and second digit lines of the respective digit line pair.

12. The DRAM array of claim 11, wherein the first and second digit lines of each pair are divided into at least first and second sections that are electrically isolated from each other, and wherein the DRAM array further comprises a pair of conductors extending through the semiconductor substrate for each of a plurality of digit line pairs, the first conductor for each pair coupling the first section of the first digit line to the second section of the second digit line, and the second conductor for each pair coupling the second section of the first digit line to the first section of the second digit line.

13. The DRAM array of claim 11 wherein a plurality of access transistors in each column are coupled to the first digit line of the respective digit line pair.

14. The DRAM array of claim 11 wherein at least some of the access transistors in each column are coupled to the second digit line of the respective digit line pair.

15. The DRAM array of claim 11 wherein alternating access transistors in each column are coupled to the first digit line of the respective digit line pair, and the remaining access transistors in the column are coupled to the second digit line of the digit line pair.

16. The DRAM array of claim 11 further comprising a plurality of field oxide regions formed in the semiconductor substrate to isolate at least some of the access transistors from each other.

17. The DRAM array of claim 11 wherein the semiconductor substrate comprises a silicon-on-insulator ("SOI") substrate.

18. A dynamic random access memory ("DRAM") fabricated on a silicon-on-insulator ("SOI") substrate, comprising:
a DRAM array comprising a plurality of memory cells arranged in rows and columns adjacent a first surface of an active silicon layer of the substrate;
a plurality of digit line pairs extending along each column of memory cells, at least a portion of a first digit line of each pair being fabricated adjacent the first surface of the active silicon layer, and at least a portion of a second digit line of each pair being fabricated adjacent a second surface of the active silicon layer, the second surface being opposite from the first surface;
a plurality of access transistors fabricated in the active silicon layer, each of the access transistors in each column being coupled between a respective memory cell and one of the first and second digit lines of the respective digit line pair;
a plurality of sense amplifiers coupled to the first and second digit lines of respective digit line pairs;
a row address decoder for selecting a row of memory cells corresponding to a row address;
a column address decoder for selecting a column of memory cells corresponding to a column address;
a data path coupled between a sense amplifier for a selected column and an external data terminal of the DRAM; and
a command decoder operable to generate control signals responsive to memory commands applied to the DRAM.

19. The DRAM of claim 18, wherein the first and second digit lines of each pair are divided into at least first and second sections that are electrically isolated from each other, and wherein the DRAM array further comprises a pair of conductors extending through the active silicon layer of the SOI substrate for each of a plurality of digit line pairs, the first conductor for each pair coupling the first section of the first digit line to the second section of the second digit line, and the second conductor for each pair coupling the second section of the first digit line to the first section of the second digit line.

20. The DRAM of claim 18 wherein a plurality of access transistors in each column are coupled to the first digit line of the respective digit line pair.

21. The DRAM of claim 18 wherein at least some of the access transistors in each column are coupled to the second digit line of the respective digit line pair.

22. The DRAM of claim 18 wherein alternating access transistors in each column are coupled to the first digit line of the respective digit line pair, and the remaining access transistors in the column are coupled to the second digit line of the digit line pair.

23. The DRAM of claim 18 further comprising a plurality of field oxide regions formed in the active silicon layer to isolate at least some of the access transistors from each other.

24. The DRAM of claim 18 wherein the SOI substrate comprises a handler wafer.

25. The DRAM of claim 18 wherein one of the digit lines is fabricated between the handler wafer and the active silicon layer.

26. A method of fabricating a DRAM array arranged in rows and columns, comprising:
providing a substrate of an insulative material covering a semiconductor material;
fabricating a first digit line of each of a plurality of digit line pairs extending along respective columns of the DRAM array, the first digit lines being fabricated on one side of the substrate;

fabricating a plurality of memory cells for each column of the DRAM array, the memory cells being fabricated adjacent a surface of the substrate opposite the one side of the substrate;

fabricating an access transistor for each memory cell, the access transistors being fabricated in the semiconductor material;

fabricating a second digit line of each of the plurality of digit line pairs, the second digit lines being fabricated on another side of the substrate; and coupling the access transistors in each column to one of the first and second digit lines extending along the respective column.

27. The method of claim 26 wherein the act of fabricating memory cells adjacent a surface of the substrate comprises:

depositing a conductive material on the substrate of insulative material to form a cell plate;

depositing a dielectric material on at least portions of the cell plate;

forming a plurality of conductive structures on the dielectric material to form a plurality of memory cell capacitors; and coating the conductive structures with an insulative material.

28. The method of claim 26 wherein the act of fabricating a second digit line of each of the plurality of digit line pairs comprises:

depositing an insulative material on the layer of semiconductor material; and depositing a conductive material on the deposited insulative material in a pattern corresponding to the second digit lines.

29. The method of claim 26 wherein the act of coupling the access transistors in each column to one of the first and second digit lines comprises:

forming a via between the access transistors in each column and the respective second digit line;

placing a conductive material in the vias, thereby coupling the access transistors in each column to respective second digit lines.

30. The method of claim 26 wherein the act coupling the access transistors in each column to one of the first and second digit lines comprises:

forming a first set of vias between alternate access transistors in each column and the respective second digit line;

forming a second set of vias between the remaining access transistors in each column and the respective first digit line;

placing a conductive material in the vias, thereby alternately coupling the access transistors in each column to the first and second digit lines.

31. The method of claim 26 further comprising twisting the first and second digit lines for each column at least once as the digit lines extend through the array.

32. The method of claim 26 further comprising forming a field oxide region adjacent at least some of the access transistors to electrically isolate access transistors from each other.

* * * * *

UNITED STATES PATENT AND TRADEMARK OFFICE
CERTIFICATE OF CORRECTION

PATENT NO. : 6,465,331 B1
DATED : October 15, 2002
INVENTOR(S) : Brent Keeth and Charles H. Dennison It is certified that error appears in the above-identified patent and that said Letters Patent is hereby corrected as shown below:

Title page,
Item [56], References Cited, OTHER PUBLICATIONS, "Giga-bit DRAM Cells with low capacitance and low resistance bit-lines on buried MOSFET's and capacitors by using bonded SOI technology-Reversed-Stacked-Capacitor (RSTC) Cell"," should read -- Giga-Bit DRAM Cells With Low Capacitance and Low Resistance Bit-Lines on Buried MOSFET's and Capacitors by Using Bonded SOI Technology-Reversed-Stacked Capacitor (RSTC) Cell," --

Column 1,
Line 42, "transistor the" should read -- transistor couples the --
Line 61, "reduced to 6F ." should read -- reduced to $6F^2$. --

Column 3,
Line 37, "and"wafer", which" should read -- and "wafer," which --
Line 52, "indicate that" should read -- indicate the --

Column 4,
Line 46, "phosphorus, boron ions." should read -- phosphorus or boron ions. --

Column 6,
Line 35, "56 together with" should read -- 56, together with --
Line 40, "methods as was" should read -- methods as were --
Line 43, "layer 44 over-" should read -- layer 44 and over- --
Line 47, "or"flipped"," should read -- or "flipped," --

Signed and Sealed this

Sixteenth Day of September, 2003

JAMES E. ROGAN
*Director of the United States Patent and Trademark Office*